United States Patent [19]
Winrow

[11] 3,947,984
[45] Apr. 6, 1976

[54] SUPPORT FOR DISPLAY ELEMENTS
[75] Inventor: Donald Winrow, Weston, Canada
[73] Assignee: Ferranti-Packard Limited, Toronto, Canada
[22] Filed: May 7, 1975
[21] Appl. No.: 575,123

[52] U.S. Cl................ 40/28 R; 339/17 C; 340/336
[51] Int. Cl.².............................................. G08B 5/22
[58] Field of Search............... 40/28 C, 28 R, 52 R; 339/17 R, 17 C, 17 F, 17 M; 340/336, 325, 381

[56] References Cited
UNITED STATES PATENTS

| | | | |
|---|---|---|---|
| 2,918,648 | 12/1959 | Ludman et al.................. | 339/17 C |
| 3,365,824 | 1/1968 | Winrow............................. | 40/28 C |
| 3,469,258 | 9/1969 | Winrow............................. | 340/336 |

Primary Examiner—John H. Wolff

[57] ABSTRACT

A display or indicating device has an array of display elements rotatably mounted on one side of a board and electrically controlled means for actuating them, where the board is of the type on which printed circuits are mounted.

2 Claims, 5 Drawing Figures

SUPPORT FOR DISPLAY ELEMENTS

This invention relates to the means for mounting display or indicating devices.

The type of display or indicating elements which will be mounted in accord with the means of the invention are exemplified by the devices shown in patents as:

U.S. Pat. No. 3,140,553 dated July 14, 1964
U.S. Pat. No. 3,283,427 dated Nov. 8, 1966
U.S. Pat. No. 3,295,238 dated Jan. 3, 1967
U.S. Pat. No. 3,365,824 dated Jan. 30, 1968
U.S. Pat. No. 3,303,494 dated Feb. 7, 1967
U.S. Pat. No. 3,624,941 dated Dec. 7, 1971

These patents disclose the mounting and operation of display elements oppositely coloured on opposite sides, which are pivotally mounted, carry a magnet for rotation therewith extending transversely to the pivotal axis, and have their orientation controlled by the application of a magnetic field exterior to the element.

Although the devices described above have utility with large and small display elements, the invention to be described is of more likely application where the display elements are of relatively large size, i.e. of 1¼ inch diameter or larger and are customarily mounted in arrays of columns and rows of such elements.

The invention provides a board for supporting an array of elements of the type referred to. The board and its arrangement when designed in accord with the invention provide economical and strong design.

It is an object of this invention to provide a board for the array where a printed circuit board, is provided on one side with the printed circuits to control the energization of the elements in the array and the same board is used as the structural support for the elements.

It is an object of this invention to provide a board for the array of resilient flexible material where the board is strengthened by being flexed or biased to a curved attitude.

Such curvature not only supplies a general channel effect to strengthen the board against distortion, but further acts to strengthen the board against differential thermal expansion caused when the front of the board is darker than the back and the board temperature increases due to convection or ambient radiation.

In drawings which illustrate a preferred embodiment of the invention:

Figure 1:
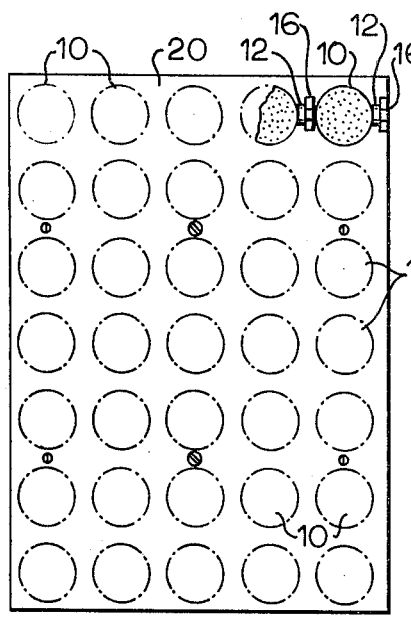
FIG. 1 shows a front view of an array of display elements mounted on a board.
Figure 3:
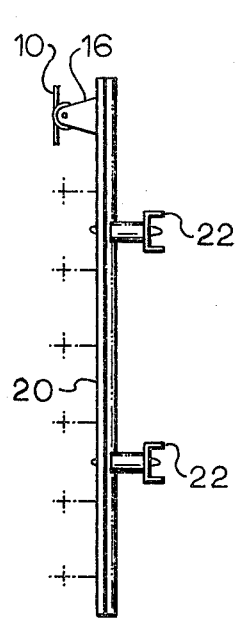
FIG. 3 shows an edge view of the equipment of FIG. 1 or FIG. 2.

In the drawings; FIG. 1 schematically represents an array of 35 rotatably mounted magnetically actuated elements 10 contrastingly coloured on opposite sides. The design of these elements for operation to each selectively display one or the other of contrasting surfaces is not covered here since such operation is well explained in the patents recited above. The arrangement shown includes a metal disc 10 mounted to rotate with a rotor magnet 12. The arrangement of the pivotal mounting shaft 14, brackets 16, energizing coil 18 and method of mounting on the board are as described in copending application Ser. No. 563,227 filed Mar. 28, 1970. However, the invention is directed to the arrangement of the board and includes any type of rotatably mounted magnetically actuable element mounted in any suitable manner thereon.

Figure 2:
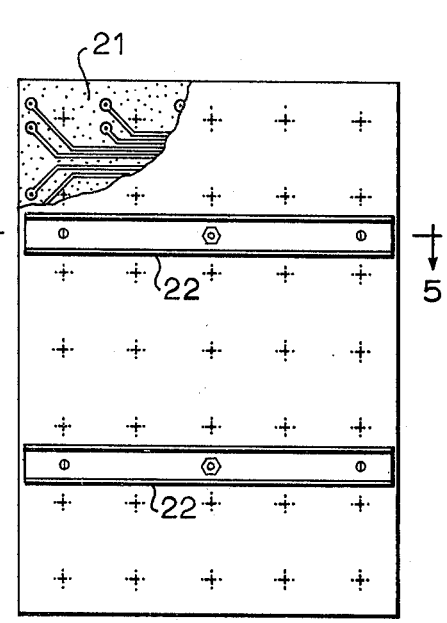
FIG. 2 shows a back view of the arrangement of FIG. 1.
Figure 5:
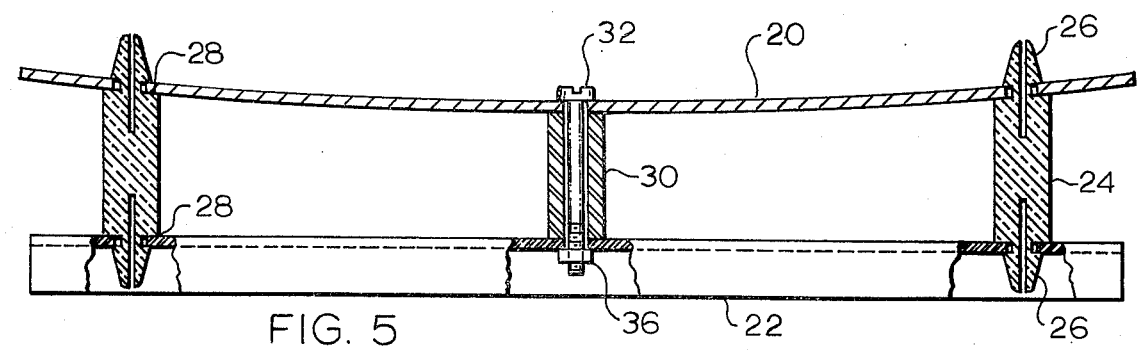
FIG. 5 is an enlarged view of the means for biasing the board.

The board 20 on which the display elements are mounted is a printed circuit board of preferably about 1/16 inch thickness customarily made of epoxy and fibre glass or polyester and fiberglass and having the printed circuit 21 for controlling the selective energization of the elements in the array located on one side thereof. (FIG. 2 for clarity only shows a portion of the printed circuits which, in fact, usually cover the entire rear surface of the board).

In one aspect the invention involves the use of the printed circuit board 20 as a structural member to support the array with the array and having the display elements mounted on the front. The elements may be attached by bolting, clips or otherwise, case being taken when making apertures in the printed circuit board to avoid damage to or interruption of the printed circuits. Included among the possible methods of attachment is shown and in commonly assigned U.S. Pat. No. 3,754,245.

It is believed that this is the first time a printed circuit board has been used as a structural member in such an array. In other words, in prior constructions, the array has been supported by a purely structural member and the printed circuit has been otherwise mounted.

In another aspect of the invention the board for supporting the invention whether of the printed circuit variety or not is made of resiliently flexible construction so that it may, on its mounting be flexed or biased thus adding to its strength in two ways.

Firstly, the curvature of the board creates a channel effect which resists bending or distortion about lines transverse to the direction about which curvature of the board takes place. There is an additional advantage where, as is common, the side of the board viewed in the viewing direction is darker than the back. In such a case, under the heat received from radiation or convection, the darker front of the array absorbs more heat than the back and correspondingly the front of the array expands more than the back. To minimize the effects of such differential expansion on the board holding the array, the board is biased to be concave on its darker (display) side. The board is strengthened in one dimension by the channel effect and any differential expansion in the other dimension has the effect of flattening the board (i.e. counteracting the curvature) rather than increasing it. Both these aspects of the invention are of particular importance with the printed circuit board, since structural qualities of the board are improved by the bowing and the differential expansion is significant between the black (front) side of the board and the side on which the lighter, rear side where the printed circuit board is exposed.

Figure 4:
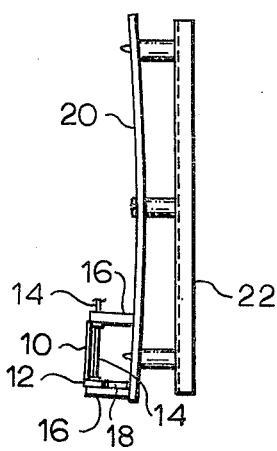
FIG. 4 shows a cross-section along the lines 4—4 of FIG. 2.

The board may be mounted in bowed arrangement in any desired manner. It is preferable, as shown in FIG. 4 that the bowing be such that the board 20 is bowed when viewed edgewise in the long dimension. With this arrangement the channel effect of the bowed board strengthens the board in its long dimension.

Although any method of flexing or biasing the board is considered within the scope of the invention the preferred method is shown in the drawings. Channel members 22 are provided to run across the array (perpendicular to the dimension in which the channel effect is desired). The channel members are designed to be strong enough to remain rigid while causing the bowing or flexing of the printed circuit board. The channel members are designed (by means not shown) to be mounted on a supporting structure or frame. The channels may be designed to support a single board, as shown, or may be designed to support a number of boards placed side by side.

Each board is connected to each channel by a central (shorter) tension member and outer (larger) compression members. Thus the outer compression members are plastic posts 24 provided with prongs 26 at each end designed to contract when pressed through holes in the channel 22 and board 20 and to snap outwardly at a predetermined location to receive the sides of the channel and the board in slots as shown. The effect of the slots is to provide for both the board and the channels outwardly facing shoulders 28 to maintain the board and the channels at the desired spacing. The central member comprises a hollow sleeve 30 designed to receive a bolt 32 passing slidably therethrough and to bear on both board 20 and channel 22 to set the spacing for the centre. The resilient flexible board, naturally flat, is bowed by bolt 32 passed from the front of the board 20, through an aperture therein through sleeve 30, through an aperture in the channel 22 and lightened into, or by nut 36. Since the length of sleeve 30 is shorter than the distance between the bearing shoulders 28 on each of the posts 24, the lightening of the nut 36 acts to bow the board 20. The dimensions of the members are chosen to produce the amount of bowing desired.

Where the pivot shaft 14 for mounting the display elements is a single shaft extending across the array to mount a number of elements, the bowing of the board will produce a small amount of bowing in shaft 14. However it is found that such bowing is not large enough to interfere with the pivotal movement of the element 10 on the shaft.

I claim:

1. In a display or indicating device, having an array of display elements rotatably mounted on one side of a resilient flexible board of the type to bear printed circuits thereon and having such a printed circuit on the side remote from the array each said rotatably mounted element being provided with opposite contrastingly coloured surfaces, a magnet mounted on each said rotatably mounted member for rotation therewith and means mounted on said display board corresponding to each element for providing responsive to electrical energization a magnetic field which controls the orientation of said magnet and said element, wherein said circuit is utilized to control said electrical energization; means for biasing said board into a concave shape facing the side on which the array is mounted.

2. In a display as claimed in claim 1 wherein the side of the display board facing the array is darker than the opposite side. side.

* * * * *